United States Patent
Zhang et al.

(10) Patent No.: US 9,674,989 B2
(45) Date of Patent: Jun. 6, 2017

(54) APPARATUS FOR COOLING SERVER CABINET AND SERVER CABINET APPARATUS

(71) Applicant: TENCENT TECHNOLOGY (SHENZHEN) COMPANY LIMITED, Shenzhen (CN)

(72) Inventors: Haitao Zhang, Shenzhen (CN); Haitao Zhou, Shenzhen (CN); Yidi Wu, Shenzhen (CN); Dianlin Li, Shenzhen (CN)

(73) Assignee: TENCENT TECHNOLOGY (SHENZHEN) COMPANY LIMITED, Shenzhen, Guangdong (CN)

( * ) Notice: Subject to any disclaimer, the term of this patent is extended or adjusted under 35 U.S.C. 154(b) by 0 days.

(21) Appl. No.: 14/827,635

(22) Filed: Aug. 17, 2015

(65) Prior Publication Data

US 2015/0382513 A1    Dec. 31, 2015

Related U.S. Application Data

(63) Continuation of application No. PCT/CN2013/091245, filed on Dec. 31, 2013.

(30) Foreign Application Priority Data

Feb. 21, 2013   (CN) .................... 2013 2 0080803 U

(51) Int. Cl.
*H05K 5/00* (2006.01)
*H05K 7/00* (2006.01)
*H05K 7/20* (2006.01)

(52) U.S. Cl.
CPC ............................ *H05K 7/20745* (2013.01)

(58) Field of Classification Search
CPC ........... H05K 7/20572; H05K 7/20581; H05K 7/20645; H05K 7/20736
(Continued)

(56) References Cited

U.S. PATENT DOCUMENTS 8,331,087 B2 * 12/2012 Wei ...................... H05K 7/1497
174/520
8,427,831 B2 * 4/2013 Wei ..................... H05K 7/20754
165/104.33
(Continued)

FOREIGN PATENT DOCUMENTS

CN    101347059 A    1/2009
CN    102339108 A    2/2012
(Continued)

*Primary Examiner* — Anthony Haughton
(74) *Attorney, Agent, or Firm* — Dilworth & Barrese, LLP; Michael J. Musella, Esq.

(57) ABSTRACT

Disclosed are an apparatus for cooling a server cabinet and a server cabinet apparatus. The apparatus for cooling a server cabinet includes: a bracket a heat-exchange device, and an air-ducting device; where the bracket is positioned below one or a plurality of server cabinets, the heat-exchange device is installed on a side surface of the bracket, the air-ducting device is installed in the bracket, the heat-exchange device and the air-ducting device are parallelly arranged, the heat-exchange device cools hot air produced by the server cabinet to obtain cold air, and the air-ducting device blows the cold air to the server cabinet to cool the server cabinet. The server cabinet apparatus includes: an apparatus for cooling a server cabinet and at least one server cabinet. With the apparatus for cooling a server cabinet, each of the servers in a data center are effectively cooled, and resources are saved.

17 Claims, 9 Drawing Sheets

(58) Field of Classification Search
USPC .......... 361/679.5, 724–727, 679.46, 679.48, 361/679.49, 679.51
See application file for complete search history.

(56) References Cited

U.S. PATENT DOCUMENTS

| | | | | |
|---|---|---|---|---|
| 8,526,182 | B2* | 9/2013 | Chen | H05K 7/20736 |
| | | | | 165/104.33 |
| 2002/0055329 | A1* | 5/2002 | Storck, Jr. | F24F 7/06 |
| | | | | 454/186 |
| 2005/0280986 | A1* | 12/2005 | Coglitore | H05K 7/20736 |
| | | | | 361/679.49 |
| 2007/0171613 | A1* | 7/2007 | McMahan | H05K 7/20736 |
| | | | | 361/695 |
| 2007/0293138 | A1* | 12/2007 | Adducci | H05K 7/186 |
| | | | | 454/184 |
| 2008/0055846 | A1* | 3/2008 | Clidaras | G06F 1/20 |
| | | | | 361/679.41 |

FOREIGN PATENT DOCUMENTS

| | | | |
|---|---|---|---|
| CN | 102802383 | A | 11/2012 |
| CN | 203219868 | U | 9/2013 |
| CN | 203353016 | U | 12/2013 |

* cited by examiner

APPARATUS FOR COOLING SERVER CABINET AND SERVER CABINET APPARATUS

This application claims priority to Chinese Patent Application No. 201320080803.3, filed before the Chinese Patent Office on Feb. 21, 2013 and entitled "APPARATUS FOR COOLING SERVER CABINET AND SERVER CABINET APPARATUS", which is incorporated by reference herein in its entirety.

TECHNICAL FIELD

The present disclosure relates to the field of computers and communications, to and in particular, to an apparatus for cooling a server cabinet and a server cabinet apparatus.

BACKGROUND

With the rapid development of computer technologies and application of large-scale Internet data centers, electronic devices are becoming more and more highly integrated, and such devices as servers may be directly installed within server cabinets. In this case, the temperature of the server cabinet directly affects the operation performance of the servers. Therefore, in an Internet data center where server cabinets are closely deployed in rows, it is a critical issue as how to cooling the server cabinets to ensure the operation performance of the servers.

As illustrated in FIG. 1, a related art provides an apparatus for cooling a server cabinet, including: a raised floor a and a support b (not illustrated in FIG. 1). The raised floor a is installed on the ground d via the support b, and a passage e is provided between the raised floor a and the ground d. The apparatus further includes an air-conditioner c implementing bottom-blowing and top-returning. In the telecommunication equipment room where a large-scale Internet data center is deployed, the air-conditioner c is positioned on the raised floor a on one side or both sides of the telecommunication equipment room, and server cabinets f are closely deployed in rows on the raised floor a in the middle of the telecommunication equipment room. The raised floor a below the air-conditioner c is provided with an air-supply outlet h, and the raised floor a between two server cabinets f is provided with a ventilation hole m. The air-conditioner c produces cold air, and the cold air is blown to the passage e between the raised floor a and the ground d via the air-supply outlet h on the raised floor below the air-conditioner c, and then the cold air is blown from the ventilation hole m on the raised floor a to the server cabinets f, thereby cooling the server cabinets E During the implementation of the present disclosure, the inventors find that the related art has at least the following problems:

Since air-conditioners are generally deployed at one side or both sides of a telecommunication equipment room, in a large-scale Internet data center, some server cabinets in the telecommunication equipment room may not sufficiently cooled. In addition, there is a large space between the raised floor and the ground, and therefore cold air in the passage is not fully used, resulting in a waste of resources.

SUMMARY

To effectively cool each of the servers in a large-scale Internet data center, and save resources, embodiments of the present disclosure provide an apparatus for cooling a server cabinet and a server cabinet apparatus. The technical solutions are as follows:

In a first aspect, an embodiment of the present disclosure provides an apparatus for cooling a server cabinet, including: a bracket, a heat-exchange device, and an air ducting device; where the bracket is positioned below one or a plurality of server cabinets, the heat-exchange device is installed on a side surface of the bracket, the air-ducting device is installed in the bracket, the heat-exchange device and the air-ducting device are parallelly arranged, the heat-exchange device cools hot air produced by the server cabinet to obtain cold air, and the air-ducting device blows the cold air to the server cabinet to cool the server cabinet.

In a second aspect, an embodiment of the present disclosure provides another apparatus for cooling a server cabinet, including: a bracket, a heat-exchange device, and an air ducting device; where the bracket is positioned below one or a plurality of server cabinets, the heat-exchange device is installed on a side surface of the bracket, the air-ducting device is installed in the bracket, the heat-exchange device and the air-ducting device are parallelly arranged, the heat-exchange device cools hot air produced by the server cabinet to obtain cold air, and the air-ducting device blows the cold air to the server cabinet to cool the server cabinet.

The air-ducting device includes a blower and a first air-ducting plate.

The heat-exchange device, the blower, and the first air-ducting plate are sequentially arranged parallelly, the blower is positioned below the server cabinet, and the first air-ducting plate is positioned on an outer side of the server cabinet.

An inner side surface of the first air-ducting plate is a concave curved surface, the inner side surface facing towards the blower; or the first air-ducting plate is a flat plate, is perpendicularly installed in the bracket, and comprises a surface facing towards the blower.

The bracket includes a first bracket and a second bracket.

One side of the first bracket is connected to one side of the second bracket, the server cabinet is placed on the first bracket, the heat-exchange device is installed on the other side of the first bracket, the blower is installed in the first bracket, and the first air-ducting plate is installed in the second bracket.

If the inner side surface of the first air-ducting plate is a concave curved surface, a second air-ducting plate is installed in the second bracket, an inner side surface of the second air-ducting plate being a concave curved surface.

A direction of the concave curved surface of the second air-ducting plate is reverse to a direction of the concave curved surface of the first air-ducting plate, such that cold air blown from a third bracket is blown to the second air-ducting plate, and the cold air is blown to the server cabinet on the third bracket via the second air-ducting plate.

One side of the third bracket is connected to the other side of the second bracket.

In a third aspect, an embodiment of the present disclosure provides a server cabinet apparatus, including: at least one server cabinet and an apparatus for cooling a server cabinet according to the first aspect.

In a fourth aspect, an embodiment of the present disclosure provides a server cabinet apparatus, including: a first server cabinet, a second server cabinet, and an apparatus for cooling a server cabinet according to the second aspect, where the first server cabinet is positioned on the first bracket, and the second server cabinet is positioned on a third bracket.

In a fifth aspect, an embodiment of the present disclosure provides an Internet data center, including at least one server cabinet apparatus according to the third or fourth aspect.

According to the embodiments of the present disclosure, a bracket is positioned below one or a plurality of server cabinets, and a heat-exchange device is installed on the side surface of the bracket, an air-ducting device is installed in the bracket, the heat-exchange device and the air-ducting device are parallelly arranged, the heat-exchange device cools hot air produced by the server cabinet to obtain cold air, and the air-ducting device blows the cold air to the server cabinet to cool the server cabinet. Since the heat-exchange device and the air-ducting device are positioned below the server cabinet, and are close to the server cabinet, the cold air is capable of directly reaching the server cabinet, thereby effectively cooling all the server cabinets in an Internet data center. In addition, this short-range air supply manner saves resources.

BRIEF DESCRIPTION OF THE DRAWINGS

For a better understanding of the technical solutions in the embodiments of the present disclosure, the accompanying drawings for illustrating the embodiments are briefly described below. Apparently, the accompanying drawings in the following description illustrate only some embodiments of the present disclosure, and persons of ordinary skill in the art may derive other accompanying drawings based on these accompanying drawings without any creative efforts.

Figure 1:
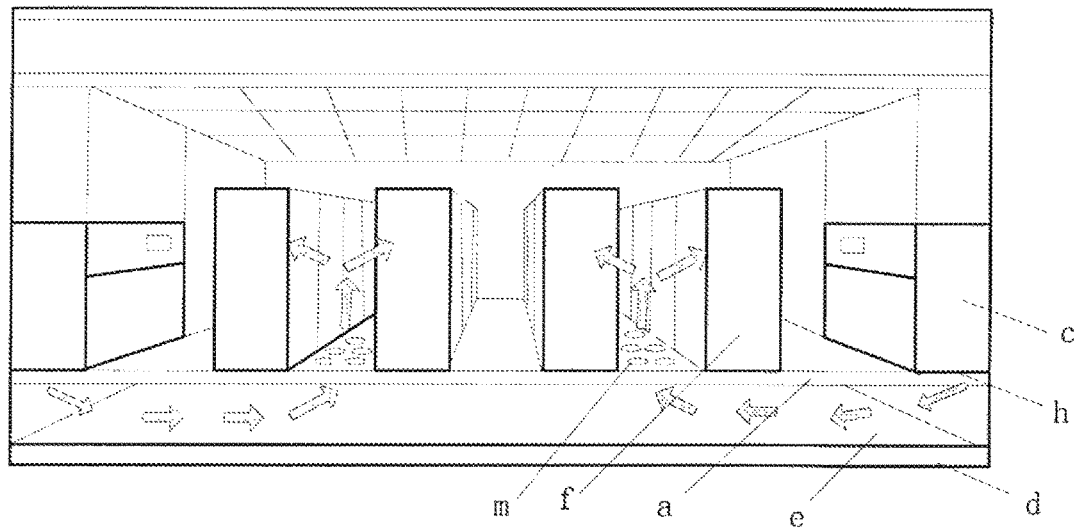
FIG. 1 is a schematic structural view of an apparatus for cooling a server cabinet according to the prior art.

REFERENCE NUMERALS AND DENOTATIONS THEREOF a: raised floor; b: support; c: air-conditioner; d: ground; e; passage;

f: server cabinet; m: ventilation hole; n: apparatus for cooling server cabinet;

1: bracket; 11: first bracket; 11a: third bracket: 111: first rectangle frame;

1111; ninth lateral rod; 1112: tenth lateral rod; 1113: first longitudinal rod; 1114: third longitudinal rod;

112: second rectangle frame; 1121: first lateral rod; 1122: second lateral rod; 1123: second longitudinal rod;

1124: fourth longitudinal rod; 113: first vertical rod; 12: second bracket; 121: third rectangle frame;

1211: eleventh lateral rod; 1212: twelfth lateral rod; 1213: fifth longitudinal rod;

1214: sixth longitudinal rod; 122: fourth rectangle frame; 1221: third lateral rod; 1222: fourth lateral rod;

1223: seventh longitudinal rod; 1224: eighth longitudinal rod; 123: second vertical rod:

2: heat-exchange device; 2a: heat-exchange device; 21: filter; 22: heat-exchanger coil;

23: fourth bracket; 241: thirteenth lateral rod; 242: fourteenth lateral rod; 243: thirteenth longitudinal rod;

244: fourteenth longitudinal rod; 251: fifteenth lateral rod; 252: sixteenth lateral rod;

253: fifteenth longitudinal rod; 254: sixteenth longitudinal rod; 31: fifth rectangle frame; 2311: fifth lateral rod;

2312: sixth lateral rod; 2313: ninth longitudinal rod; 2314: tenth longitudinal rod; 232: sixth rectangle frame;

2321: seventh lateral rod; 2322: eighth lateral rod; 2323: eleventh longitudinal rod;

2324: twelfth longitudinal rod; 223: third vertical rod; 224: ground feet; 24: first supporting framework;

25: second supporting framework; 3: air-ducting device, 31: blower; 31a: blower;

32: first air-ducting plate; 32a : second air-ducting plate; 4: server cabinet, first server cabinet;

4a: second server cabinet.

DETAILED DESCRIPTION

To make the objectives, technical solutions, and advantages of the present disclosure clearer, embodiments of the present disclosure are described in detail below with reference to the accompanying drawings.

Figure 2:
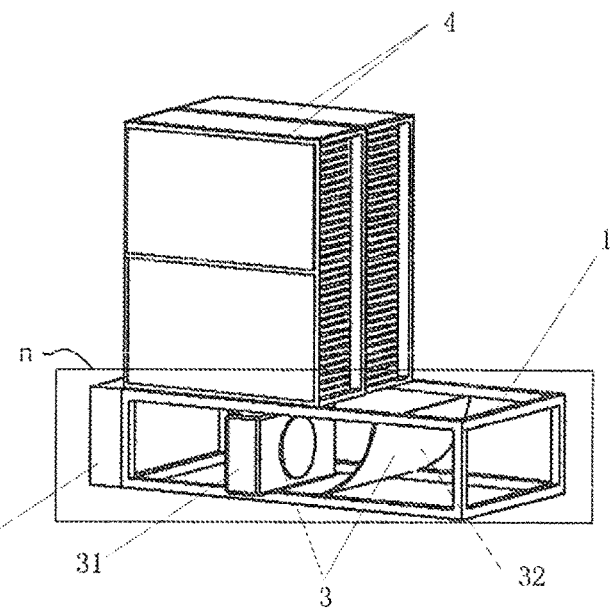
FIG. 2 is a schematic structural view of a server cabinet apparatus according to an embodiment of the present disclosure.
Figure 3:
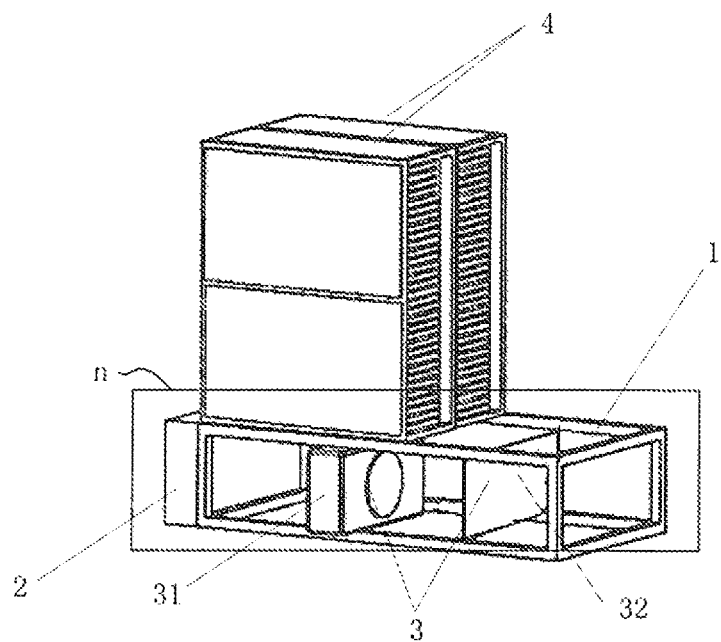
FIG. 3 is a schematic structural view of another server cabinet apparatus according to an embodiment of the present disclosure.

An embodiment of the present disclosure provides an apparatus for cooling a server cabinet. The apparatus may be applied to a server cabinet apparatus as illustrated in FIG. 2 or FIG. 3, and the server cabinet apparatus includes an apparatus n for cooling a server cabinet and a server cabinet 4. The apparatus n is positioned below the server cabinet 4.

The apparatus n includes: a bracket 1, a heat-exchange device 2, and an air ducting device 3.

The bracket 1 is positioned below one or a plurality of server cabinets 4, the heat-exchange device 2 is installed on a side surface of the bracket 1, the air-ducting device 3 is installed in the bracket 1, the heat-exchange device 2 and the air-ducting device 3 are parallelly arranged, the heat-exchange device 2 cools hot air produced by the server cabinet 4 to obtain cold air, and the air-ducting device 3 blows the cold air to the server cabinet 4 to cool the server cabinet 4.

The bracket 1 below each of the server cabinets 4 is installed with the heat-exchange device 2 and the air-ducting device 3, and the heat-exchange device 2 and the air-ducting device 3 are close to the server cabinet 4 above the bracket L Therefore, each of the server cabinets 4 is cooled by the corresponding heat-exchange device 2 and the air-ducting device 3, thereby preventing the problem in the related art that the servers deployed in the middle of the telecommunication equipment room fail to be effectively cooled and resources are wasted because the air-conditioners are deployed in both sides of the telecommunication equipment room.

One server cabinet may correspond to one bracket 1 or a plurality of server cabinets 4 may correspond to a bracket 1. When the bracket 1 is sufficiently large, the plurality of server cabinets 4 may be simultaneously positioned on one bracket 1, thereby saving space.

The heat-exchange device 2 and the bracket 1 may be assembled together in a thread connection manner. The thread connection manner includes a bolt connection manner, a screw connection manner, or a double-head bolt connection manner.

For example, the heat-exchange device 2 and the bracket 1 may be assembled together in the bolt connection manner, or may be assembled together in the screw connection manner, or may be assembled together in the double-head bolt connection manner.

When the heat-exchange device 2 needs inspection and repair, the heat-exchange device 2 may be separated from the bracket 1 by loosing the bolt or screw connected therebetween, such that the heat-exchange device 2 is removed, thereby facilitating inspection and repair of the heat-exchange device 2.

The air-ducting device 3 includes a blower 31 and a first air-ducting plate 32, where the heat-exchange device 2, the blower 31, and the first air-ducting plate 32 are sequentially arranged parallelly, the blower 31 is positioned below the server cabinet 4, and the first air-ducting plate 32 is positioned on an outer side of the server cabinet 4.

Referring to FIG. 2, an inner side surface of the first air-ducting plate 32 is a concave curved surface, the inner side surface facing towards the blower 31; or referring to FIG. 3, the first air-ducting plate 32 is a flat plate, which is perpendicularly installed in the bracket, and comprises a surface facing towards the blower 31.

Preferably, the inner side surface of the first air-ducting plate 32 is a concave curved surface.

If the inner side surface of the first air-ducting plate 32 is a concave curved surface, the blower 31 blows the cold air to the first air-ducting plate 32, and under the action of the concave curved surface of the first air-ducting plate 32, a movement direction of the cold air may be change such that the cold air reaches the server cabinet 4 conveniently.

The blower 31 is positioned between the heat-exchange device 2 and the first air-ducting plate 32.

Figure 4:
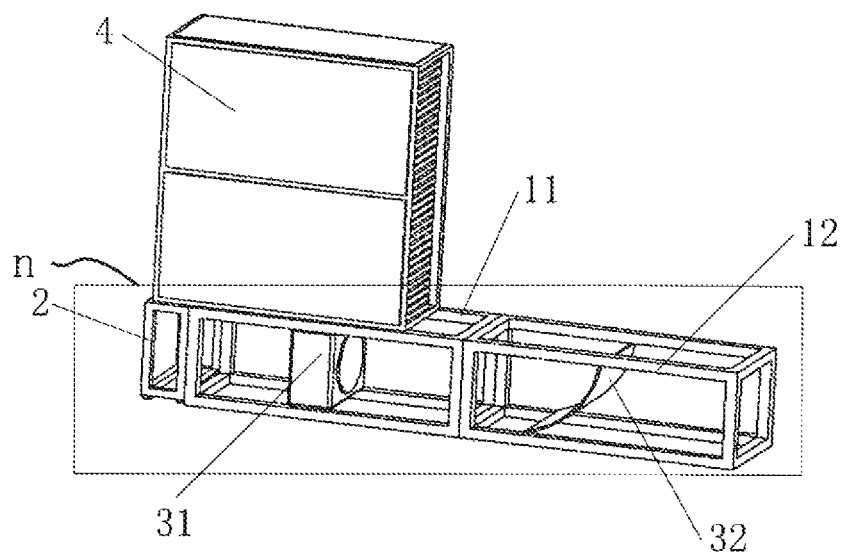
FIG. 4 is a schematic structural view of still another third cabinet apparatus according to an embodiment of the present disclosure.

As illustrated in FIG. 4, the bracket may include a first bracket 11 and a second bracket. 12, one side of the first bracket 11 is connected to the other side of the second bracket 12, the server cabinet 4 is positioned on the first bracket 11, the heat-exchange device 2 is installed on the other side of the first bracket 11, the blower 31 is installed, in the first bracket 11, and the first air-ducting plate 32 is installed in the second bracket 12.

One server cabinet 4 may be positioned on one first bracket 11. When the first bracket 11 is sufficiently large, a plurality of server cabinets 4 may be simultaneously positioned on one first bracket 11, thereby saving space. For example, FIG. 4 illustrates a scenario where one server cabinet 4 is positioned on the first bracket 11.

The server cabinet 4 produces hot air and blows the produced hot air to the heat-exchange device 2, and the heat-exchange device 2 cools the hot air to obtain cold air, and blows the cold air to the blower 31, such that the cold air is blown by the blower 31 to the first air-ducting plate 32. The inner side surface of the first air-ducting plate 32 is a concave curved surface, and the inner side surface faces towards the blower 31. Under the action of the concave curved surface of the first air-ducting plate 32, the movement direction of the cold air is changed such that the cold air reaches the server cabinet 4 above the first bracket 11 thereby cooling the server cabinet 4. Alternatively, the first air-ducting plate 32 is a flat plate, and the first air-ducting plate 32 is perpendicularly installed in the bracket 1; and under blockage of the first air-ducting plate 32, the cold air is blown to the server cabinet 4 above the first bracket 11, thereby cooling the server cabinet 4.

The first bracket 11 below the server cabinet 4 is installed with the heat-exchange device 2 and the blower 31, and the second bracket 12 connected to the first bracket 11 is installed with the first air-ducting plate 32, such that the cold air reaches the server cabinet 4, thereby effectively cooling the server cabinet 4.

The blower 31 installed in the first bracket 11 is capable of blowing the cold air to the first air-ducting plate 32, such that the server cabinet 4 is cooled. Therefore, the first bracket 11 implements an air blowing function in addition to the function of supporting the server cabinet 4.

When the bracket 1 is formed by the first bracket 11 and the second bracket 12, manufacture and transportation of the bracket 11 is more convenient. To be specific, both the first bracket 11 and the second bracket 12 may be separately manufactured and transported, and assembled onsite to form the bracket 1, thereby achieving modularized assembling of the bracket 1. Modularization of the cooling apparatus is favorable to integration of the cooling apparatus with the server cabinet, and meanwhile, modular assembling of cooling apparatuses greatly facilitates construction and maintenance of the Internet data center.

The distance between the blower 31 and the heat-exchange device 2 falls within a first preset range, the distance between the blower 31 and the first air-ducting plate 32 falls within a second preset range, and the distance between the first air-ducting device 32 and the server cabinet 4 falls within a third preset range, such that the heat-exchange device 2 cools the hot air produced by the server cabinet 4 to obtain the cold air, the blower 31 accelerates to blow the cold air to the first air-ducting plate 32, and the cold air is blown to the server cabinet 4 via the first air-ducting plate 32.

The first preset range, the second preset range, and the third preset range may be such determined according to the size of the server cabinet 4, the size of the first bracket 11, and the size of the second bracket 12, that it is ensured that the cold air obtained by the heat-exchange device 2 reaches, under accelerated operation of the blower 31, the first air-ducting plate 32, and cools the server cabinet 4.

As illustrated in FIG. 2, when the heat-exchange device 2 is installed on one side of the bracket 1 and the blower 31 and the first air-ducting plate 32 are installed in the bracket 1, the length of the bracket is larger than that of the server cabinet 4. Using the length of the bracket 1 being 2000 mm as an example, the first preset range may he from 400 to 500 mm, the second preset range may he from 400 to 600 mm, and the third preset range may be from 200 to 300 mm. Preferably, the length of the bracket 1 may be twice the length of the server cabinet 4, the blower 31 is installed at a position that is ⅓ length of the bracket 1 from the heat-exchange device 2, and the first air-ducting plate 32 is installed at a position that is ⅔ length of the bracket 1 from the blower 31.

As illustrated in FIG. 4, when the heat-exchange device 2 is installed on one side of the first bracket 11, the blower 31 is installed in the first bracket 11, and the first air-ducting plate 32 is installed in the second bracket 12, the server cabinet 4 is positioned on the first bracket 11. Using the lengths of the first bracket 11 and the second bracket 12 both being 1000 mm as an example, the first preset range may be from 400 to 600 mm, the second preset range may be from 400 to 600 mm, and the third preset range may be from 200 to 300 mm. Preferably, the length of the first bracket 11 may be equal to that of the server cabinet 4, and the length of the second bracket 12 may he equal to that of the first bracket, such that the blower 31 may be installed in the middle of the first bracket 11 and the first air-ducting plate 32 may be installed in the middle of the second bracket 12.

The air outlet of the blower 31 may be provided with a first temperature sensor.

The first temperature sensor is configured to measure the temperature of the cold air, such that the system judges, according to the measured temperature of the cold air, whether a preset cooling temperature is reached, and further adjusts the temperature for cooling.

Figure 5:
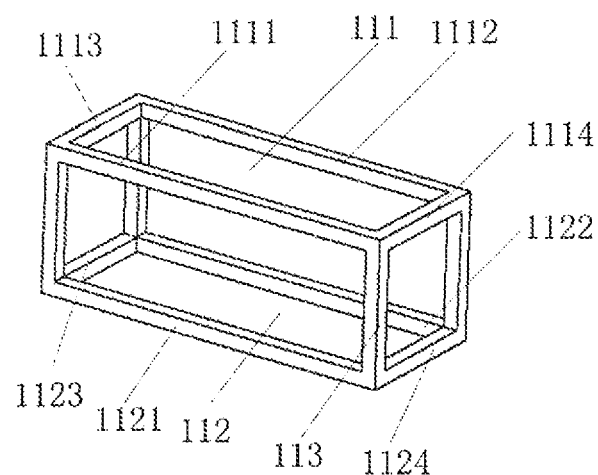
FIG. 5 is a schematic structural view of a first bracket according to an embodiment of the present disclosure.

As illustrated in FIG. 5, the first bracket 11 includes a first rectangle frame 111, a second rectangle frame 112, and four first vertical rods, where the size of the first rectangle frame Ill is equal to that of the second rectangle frame 112.

One ends of the four vertical rods 113 are respectively connected to the four apex angles of the first rectangle frame Ill, and the other ends of the four vertical rods 113 are respectively connected to the four apex angles of the second rectangle frame 112, the first rectangle frame 111 is positioned over the second rectangle frame 112, and the server cabinet 4 is positioned on the first rectangle frame 111.

The first rectangle frame 111 includes a ninth lateral rod 1111, a tenth lateral rod 1112, a first longitudinal rod 1113, and a third longitudinal rod 1114. One end of the ninth lateral rod 1111 is connected to one end of the first longitudinal rod 1113, the other end of the ninth lateral rod 1111 is connected to one end of the third longitudinal rod 1114, one end of the tenth lateral rod 1112 is connected to the other end of the first longitudinal rod 1113, and the other end of the tenth lateral rod 1112 is connected to the other end of the third longitudinal rod 11114.

The second rectangle frame 112 includes a first lateral rod 1121, a second lateral rod 1122, a second longitudinal rod 1123, and a fourth longitudinal rod 1124. One end of the first lateral rod 1121 is connected to one end of the second longitudinal rod 1123, the other end of the first lateral rod 1121 is connected to one end of the fourth longitudinal rod 1124, one end of the second lateral rod 1122 is connected to the other end of the second longitudinal rod 1123, and the other end of the second lateral rod 1122 is connected to the other end of the fourth longitudinal rod 1124.

Figure 6:
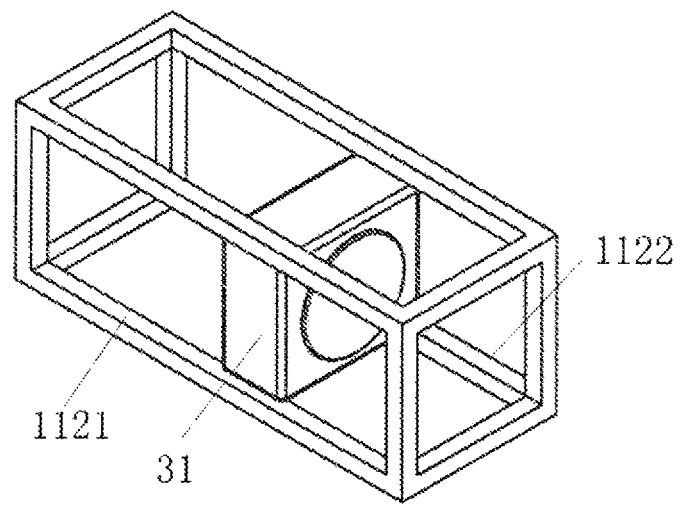
FIG. 6 is a schematic structural view of installation of a blower according to an embodiment of the present disclosure.

As illustrated in FIG. 6, the blower 31 may be installed on the first lateral rod 1121 and the second lateral rod 1122 of the second rectangle frame 112.

The height of the blower 31 is smaller than or equal to that of the first bracket, and the width of the blower 31 is smaller than or equal to that of the first bracket 11. When the blower 31 needs periodical inspections, or needs repair due to faults, the blower 31 may be removed from the front face of the first bracket 11, and then inspected and repaired.

Figure 7:
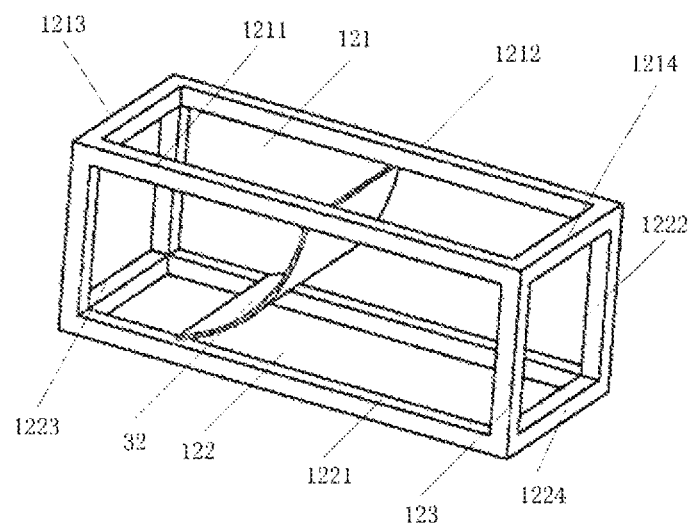
FIG. 7 is a schematic structural view of a second bracket according to an embodiment of the present disclosure.

As illustrated in FIG. 7, the second bracket 12 includes a third rectangle frame 121, a fourth rectangle frame 122, and four vertical rods 123. The size of the third rectangle frame 121 is equal to that of the fourth rectangle frame 122, one ends of the four vertical rods 123 are respectively connected to the four apex angles of the third rectangle frame 121, the other ends of the four vertical rods 123 are respectively connected to the four apex angles of the fourth rectangle frame 122, and the third rectangle frame 121 is positioned over the fourth rectangle frame 122.

The third rectangle frame 121 includes an eleventh lateral rod 1211, a twelfth lateral rod 1212, a fifth longitudinal rod 1213, and a sixth longitudinal rod 1214.

One end of the eleventh lateral rod 1211 is connected to one end of the fifth longitudinal rod 1213, the other end of the eleventh lateral rod 1211 is connected to one end of the sixth longitudinal rod 1214, one end of the twelfth lateral rod 1212 is connected to the other end of the fifth longitudinal rod 1213, and the other end of the twelfth lateral rod 1212 is connected to the other end of the sixth longitudinal rod 1214.

The fourth rectangle frame 122 includes a third lateral rod 1221, a fourth lateral rod 1222, a seventh longitudinal rod 1223, and an eighth longitudinal rod 1224. One end of the third lateral rod 1221 is connected to one end of the seventh longitudinal rod 1223, the other end of the third lateral rod 1221 is connected to one end of the eighth longitudinal rod 1224, one end of the fourth lateral rod 1222 is connected to the other end of the seventh longitudinal rod 1223, and the other end of the fourth lateral rod 1222 is connected to the other end of the eighth longitudinal rod 1224.

The first air-ducting plate 32 may be installed on the third lateral rod 1221 and the fourth lateral rod 1222 of the fourth rectangle frame 122.

The height of the second bracket 12 installed with the first air-ducting plate 32 may be larger than the height of the first bracket 11, or may be smaller than the height of the first bracket 11, or may be equal to the height of the first bracket 11. Preferably, the height of the second bracket 12 may be equal to that of the first bracket 11.

Figure 8:
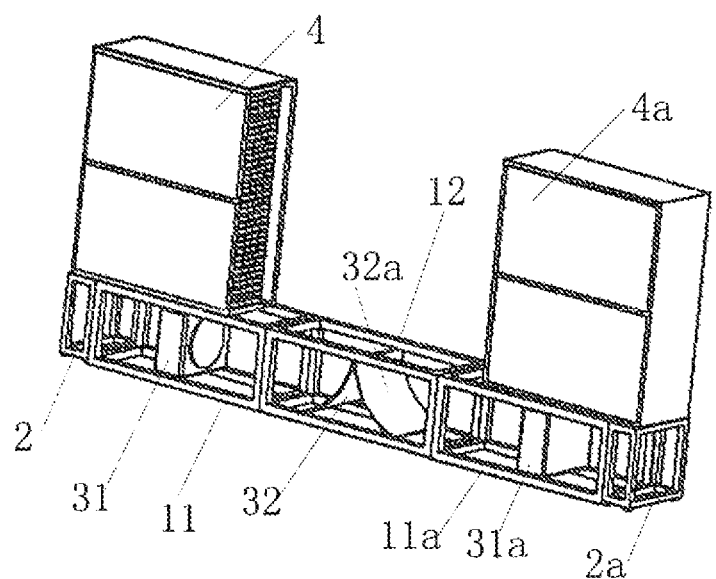
FIG. 8 is a schematic structural view of a still another server cabinet apparatus according to an embodiment of the present disclosure.

As illustrated in FIG. 8, if the inner side surface of the first air-dueling plate 32 is a concave curved surface, the second bracket 12 may also be installed with a second air-ducting plate 32a, where the inner side surface of the second air-ducting plate 32a may also be a concave curved surface. The direction of the concave curved surface of the second air-ducting plate 32a is reverse to the direction of the concave curved surface of the first air-ducting plate 32 such that cold air blown from a third bracket 11a is blown to the second air-ducting plate 32a, and the cold air is blown to a second server cabinet 4a via the second air-ducting plate 32a.

The third bracket 11a is installed with a blower 31a and a heat-exchange device 2a is installed on the side surface of the third bracket 11a. The structure of the third bracket 11a below the second server cabinet 4a may be the same as the structure of the first bracket. FIG. 8 illustrates a scenario where the structure of the third bracket 11a is the same as the structure of the first bracket 11.

The first bracket 11, the second bracket 12, the heat-exchange device 2, the blower 31, and the first air-ducting plate 32 form an apparatus for cooling a server cabinet. The first air-ducting plate 32 is positioned in the second bracket 12, the concave curved surface of the first air-ducting plate 32 faces towards the blower 31. The third bracket 11a, the second bracket 12, the heat-exchange device 2a, the blower 31a and the second air-ducting plate 32a form another apparatus for cooling a server cabinet. The second air-ducting plate 32a is positioned in the second bracket 12, and the concave curved surface of the second air-ducting plate 32a faces towards the blower 31a.

When the second bracket 12 is simultaneously installed with the first air-ducting plate 32 and the second air-ducting plate 32a, two apparatuses for cooling server cabinets may share the same second bracket 12, thereby saving materials and space.

Figure 9:
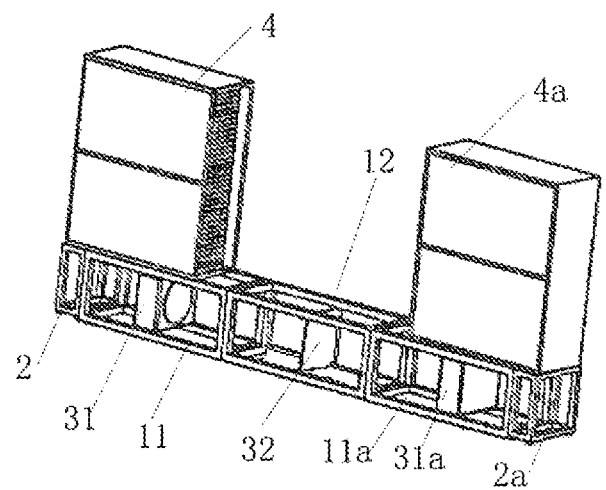
FIG. 9 is a schematic structural view of yet still another server cabinet apparatus according to an embodiment of the present disclosure.

As illustrated in FIG. 9, the first air-ducting plate 32 is a flat plate, the first air-ducting plate 32 is perpendicularly installed in the second bracket 12, the first air-ducting plate 32 is perpendicular to the fourth rectangle frame 122 of the second bracket 12, and the first air-ducting plate 32 includes a surface facing the blower 31. In this way, the two apparatuses for cooling server cabinets may share the same second bracket 12 and first air-ducting plate 32, thereby saving materials and space.

Figure 10:
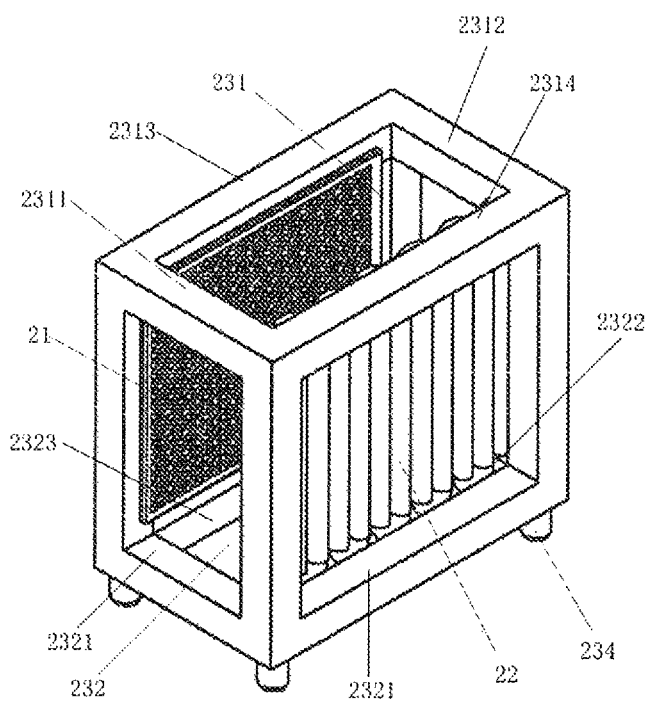
FIG. 10 is a schematic structural view of a heat-exchange device according to an embodiment of the present disclosure.

As illustrated in FIG. 10, the heat-exchange device 2 includes a filter mesh 21, a heat-exchange coil 22, and a fourth bracket 23. The filter mesh 21 and the heat-exchanger coil 22 are installed in the fourth bracket 23, and the heat-exchanger coil 22 is positioned on a side facing towards the blower 31. The filter mesh 21 and the heat-exchanger coil 22 are parallelly arranged, or the filter mesh 21 and the heat-exchanger coil 22 are such arranged as to form a preset angle. One side of the fourth bracket 23 is connected to one side of the bracket 11.

The filter mesh 21 and the heat-exchanger coil 22 are such arranged as to form a preset angle, where the angle may be from 0 to 45 degrees.

The hot air produced by the server cabinet 4 is filtered by the filter mesh 21, and reaches the heat-exchanger coil 22, such that the heat-exchanger coil 22 cools the filtered hot air.

Figure 11:
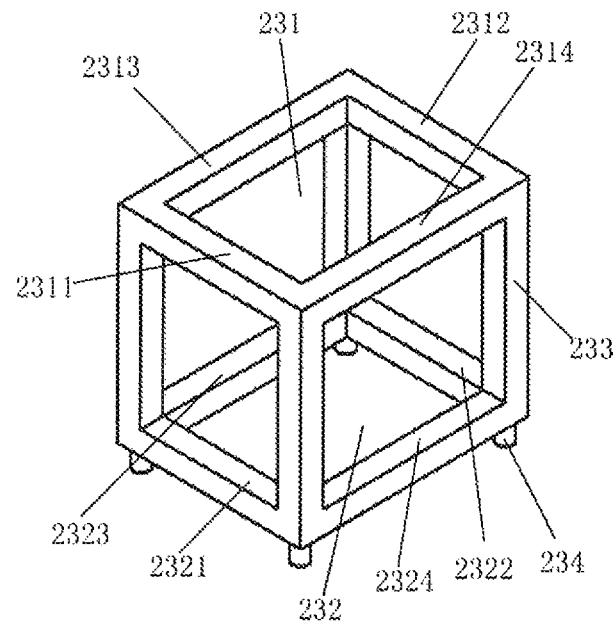
FIG. 11 is a schematic structural view of a fourth bracket according to an embodiment of the present disclosure.

As illustrated in FIG. 11, the fourth bracket 23 may be in a rectangle frame structure, the side surface of the fourth bracket 23 is connected to the side surface where the first longitudinal rod 1113 of the first rectangle frame 111 and the second longitudinal rod 1123 of the second rectangle frame 112 are positioned.

The rectangle frame structure may be a cubic frame structure.

The fourth bracket 23 includes a fifth rectangle frame 231, a sixth rectangle frame 232, and four vertical rods 233. The size of the fifth rectangle frame 231 is equal to that of the sixth rectangle frame 232, one ends of the four vertical rods 233 are respectively connected to the four apex angles of the fifth rectangle frame 231, the other ends of the four vertical rods 233 are respectively connected to the four apex angles of the sixth rectangle frame 232, and the fifth rectangle frame 231 is positioned over the sixth rectangle frame 232.

The fifth rectangle frame 231 includes a fifth lateral rod 2311, a sixth lateral rod 2312, a ninth longitudinal rod 2313, and a tenth longitudinal rod 2314. One end of the fifth lateral rod 2311 is connected to one end of the ninth longitudinal rod 2313, the other end of the fifth lateral rod 2311 is connected to one end of the tenth longitudinal rod 2314, one end of the sixth lateral rod 2312 is connected to the other end of the ninth longitudinal rod 2313, and the other end of the sixth lateral rod 2312 is connected to the other end of the tenth longitudinal rod 2314.

The sixth rectangle frame 232 includes a seventh lateral rod 2321, an eighth lateral rod 2322, an eleventh longitudinal rod 2323, and a twelfth longitudinal rod 2324. One end of the seventh lateral rod 2321 is connected to one end of the eleventh longitudinal rod 2323, the other end of the seventh lateral rod 2321 is connected to one end of the twelfth longitudinal rod 2324, one end of the eighth lateral rod 2322 is connected to the other end of the eleventh longitudinal rod 2323, and the other end of the eighth lateral rod 2322 is connected to the other end of the twelfth longitudinal rod 2324.

As illustrated in FIG. 10, using a scenario where the filter mesh 21 and the heat-exchanger coil 22 are parallelly arranged as an example, the filter mesh 21 may be installed on a plane where the eleventh longitudinal rod 2323 and the ninth longitudinal rod 2313 are positioned, and the heat-exchanger coil 22 may be installed on a plane where the twelfth longitudinal rod 2324 and the tenth longitudinal rod 2314 are positioned.

The fourth bracket 23 may further includes a height adjusting member capable of adjusting the height of the fourth bracket 23, where the height of the fourth bracket 23 is smaller than that of the first bracket 11.

As illustrated in FIG. 10 or FIG. 11, the height adjusting member may be four height-adjustable ground feet 234, and the fifth rectangle frame 231 of the fourth bracket is positioned over the sixth rectangle frame 232 of the fourth bracket 23, where the four ground feet 234 are respectively installed on the four apex angles of the sixth rectangle frame 232.

As illustrated in FIG. 4, when the fourth bracket 23 includes the four height-adjustable ground feet 234, the heights of the ground feet 234 may be adjusted such that the fifth rectangle frame 231 of the fourth bracket 23 and the first rectangle frame 111 of the first bracket 11 are positioned on the same plane, and are connected to one side of the fourth bracket 23 and one side of the first bracket 11. Then, the server cabinets are simultaneously positioned above the first bracket 11 and the fourth bracket 23. When the heat-exchange device 2 needs inspection and repair, the first bracket 11 and the fourth bracket 23 may be separated first, and the fourth bracket 23 below the server cabinet 4 is removed. Afterwards, the heat-exchange device 2 is inspected and repaired.

Figure 12:
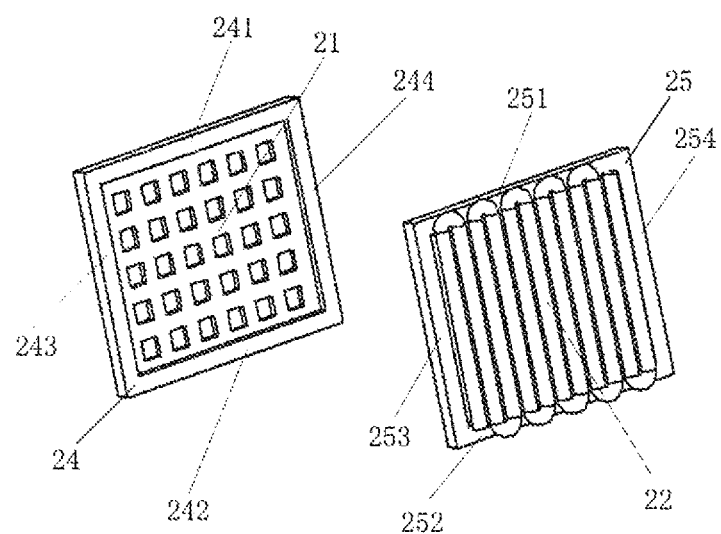
FIG. 12 is a schematic structural view of a First support framework and a second support framework according to an embodiment of the present disclosure.

As illustrated in FIG. 12, the heat-exchange device 2 may further include a first supporting framework 24 and a second supporting framework 25.

The first supporting framework 24 includes a thirteenth lateral rod 241, a fourteenth lateral rod 242, a thirteenth longitudinal rod 243, and a fourteenth longitudinal rod 244. One end of the thirteenth lateral rod 241 is connected to one end of the thirteenth longitudinal rod 243, the other end of the thirteenth lateral rod 241 is connected to one end of the fourteenth longitudinal rod 244, one end of the fourteenth lateral rod 242 is connected to the other end of the thirteenth longitudinal rod 243, and the other end of the fourteenth lateral rod 242 is connected to the other end of the fourteenth longitudinal rod 244.

The second supporting framework 25 includes a fifteenth lateral rod 251, a sixteenth lateral rod 252, a fifteenth longitudinal rod 253, and a sixteenth longitudinal rod 254. One end of the fifteenth lateral rod 251 is connected to one end of the fifteenth longitudinal rod 253, the other end of the fifteenth lateral rod 251 is connected to one end of the sixteenth longitudinal rod 254, one end of the sixteenth lateral rod 252 is connected to the other end of the fifteenth longitudinal rod 253, and the other end of the sixteenth lateral rod 252 is connected to the other end of the sixteenth longitudinal rod 254.

The filter mesh 21 is installed on the first supporting framework 24, and the heat-exchanger coil 22 is installed on the second supporting framework 25. When the heat-exchanger coil 22 is installed on the first bracket 11, the second supporting framework is positioned between the first supporting framework 24 and the blower 31.

The first supporting framework 24 and the second supporting framework 25 may be installed in the fourth bracket 23 in the following ways:

Two apex angles at one end of the first supporting framework 24 are respectively fixed to the fifth lateral rod 2311 of the fifth rectangle frame and the seventh lateral rod 2321 of the sixth rectangle frame 232, and two apex angles at the other end of the first supporting framework 24 are respectively fixed to the sixth lateral rod 2312 of the fifth rectangle frame 231 and the eighth lateral rod 2322 of the sixth rectangle frame 232.

Two apex angles at one end of the second supporting framework 25 are respectively fixed to the fifth lateral rod 2311 of the fifth rectangle frame and the seventh lateral rod 2321 of the sixth rectangle frame 232, and two apex angles at the other end of the second supporting framework 25 are respectively fixed to the sixth lateral rod 2312 of the fifth rectangle frame 231 and the eighth lateral rod 2322 of the sixth rectangle frame 232.

The hot air produced by the server cabinet 4 is filtered by the filter mesh 21, and reaches the heat-exchanger coil 22, such that the filtered hot air is cooled.

The first rectangle frame 24 may be parallel with the second rectangle frame 25, or the first rectangle frame 24 and the second rectangle frame 25 may be such arranged as to form a preset angle.

The preset angle may be from 0 to 45 degrees.

The side surface of the filter mesh 21 is connected to the side surface of the heat-exchanger coil 22, and the filter mesh 21 and the heat-exchanger coil 22 are parallelly arranged.

Figure 13A:
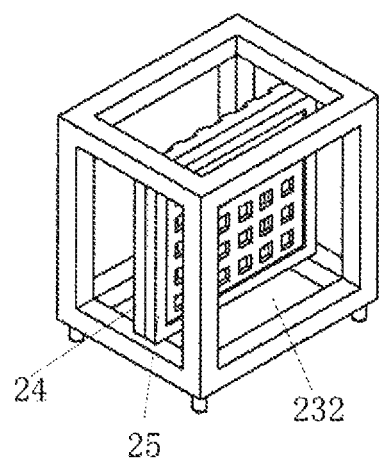
FIG. 13a is a schematic structural view of installation of a heat exchanger according to an embodiment of the present disclosure.
Figure 13B:
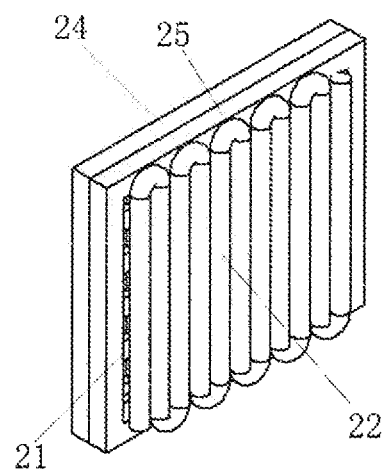
FIG. 13b is a schematic structural view of a heat-exchanger according to an embodiment of the present disclosure.

When the first rectangle frame 111 is parallel with the second rectangle frame 112, as illustrated in FIG. 13a and FIG. 13b, the filter mesh 21 is installed on the first supporting framework 24, and the heat-exchanger coil 22 is installed on the second supporting framework 25. The side surface of the first supporting framework 24 may be connected to the side surface of the second supporting framework 25, and the first supporting framework 24 is parallel with the second supporting framework 25. When the first supporting framework 24 and the second supporting framework 25 are installed in the fourth bracket 23, the first supporting framework 24 is perpendicular to the sixth rectangle frame 232 of the fourth bracket 23, and the second supporting framework 25 is perpendicular to the sixth rectangle frame 232 of the fourth bracket 23.

Figure 14A:
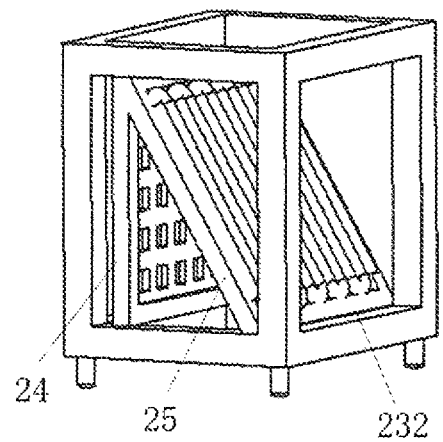
FIG. 14a is a schematic structural view of installation of another heat exchanger according to an embodiment of the present disclosure.
Figure 14B:
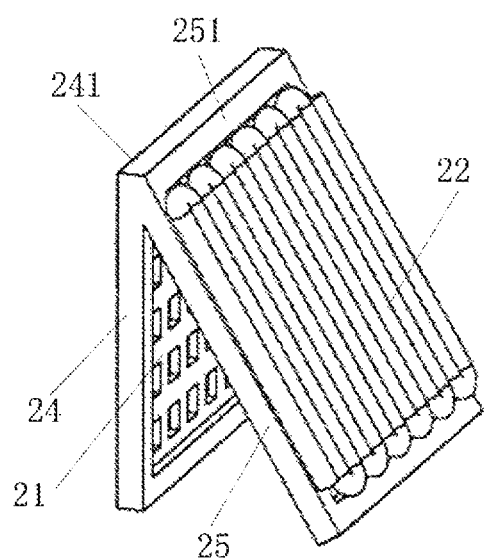
FIG. 14b is a schematic view of another heat-exchanger according to an embodiment of the present disclosure.
Figure 15:
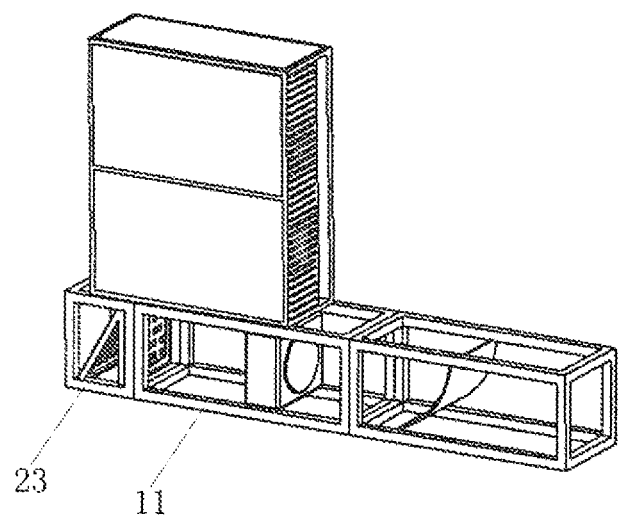
FIG. 15 is a schematic structural view of yet still another server cabinet apparatus according to an embodiment of the present disclosure.

When the filter mesh 21 and the heat-exchanger coil 22 form a preset angle therebetween, as illustrated in FIG. 14a and FIG. 14b, the filter mesh 21 is installed on the first supporting framework 24, and the heat-exchanger coil 22 is installed on the second supporting framework 25. The top of the first supporting framework 24 may be connected to the top of the second supporting framework 25, such that the first supporting framework 24 and the second supporting framework 25 form a preset range therebetween. The thirteenth lateral rod 241 of the first supporting framework 24 is connected to the fifteenth lateral rod 251 of the second supporting framework 25. When the first supporting framework 24 and the second supporting framework 25 are installed in the fourth bracket 23, the first supporting framework 24 is perpendicular to the sixth rectangle frame 232 of the fourth bracket 23, and the second supporting framework 25 and the sixth rectangle frame 232 of the fourth bracket 23 form a preset angle therebetween. This installation manner greatly increases the area where the hot an is in contact with the heat-exchanger coil 22, thereby achieving a better cooling effect.

The heat-exchange device 2 further includes a second temperature sensor, where the second temperature sensor is installed on the side of the filter mesh 21 which side faces towards the heat-exchanger coil 22.

The second temperature sensor is configured to measure the temperature of the hot air, such that the system adjusts the cooling temperature of according to measured temperature of the hot air.

The filter mesh 21 and the heat-exchanger coil 22 may be directly installed in the fourth bracket 23. Alternatively, the filter mesh 21 may be installed on the first supporting framework 24 and the heat-exchanger coil 22 may be installed on the second supporting framework 25, thereby fixing the first supporting framework 24 and the second supporting framework 25 to the fourth bracket 23.

The height, of the fourth bracket 23 may be larger than that of the first bracket 11, or the height of the fourth bracket 23 may be smaller than that of the first bracket 11, or the height of the fourth bracket 23 may be equal to that of the first bracket 11.

Preferably, as illustrated in 1G 15, the height of the foci h bracket 23 is equal to that of the first bracket 11.

The server cabinet 4 is simultaneously positioned above the first bracket 11 and the fourth bracket 23, the filter mesh 21 is installed on the first supporting framework 24, the heat-exchanger coil 22 is installed on the second supporting framework 25, and the first supporting framework 24 and the second supporting framework 25 are fixed to the fourth bracket 24. When the filter mesh 21 and the heat-exchanger coil 22 in the fourth bracket 23 need inspection and repair, the first supporting framework 24 and the second supporting framework 25 may be separated from the fourth bracket 23, and then removed, thereby facilitating inspection and repair of the filter mesh 21 and the heat exchanger coil 22.

The server cabinet 4 may also be positioned only above the first bracket 11. When the filter mesh 21 and the heat-exchanger coil 22 in the fourth bracket 23 need inspection and repair, the first supporting framework 24 and the second supporting framework 25 may be separated from the fourth bracket 23, and the removed; or the fourth bracket 23 may be separated from the first bracket 11, and then removed, thereby facilitating inspection and repair of the filter mesh 21 and the heat-exchanger coil 22.

When the height of the fourth bracket 23 is larger than that of the first bracket 11, the fourth bracket 23 is installed on the side surface of the first bracket 11, the server cabinet 4 is positioned above the first bracket 11, the filter mesh 21 is installed on the first supporting framework 24, the heat-exchanger coil 22 is installed on the second supporting framework 25, and the first supporting framework 24 and the second supporting framework 25 are fixed to the fourth bracket 23. When the filter mesh 21 and the heat-exchanger coil 22 need inspection and repair, the first supporting framework 24 and the second supporting framework 25 may be separated from the fourth bracket 23, and then removed, thereby facilitating inspection and repair of the filter mesh 21 and the heat-exchanger coil 22.

As illustrated in FIG. 4, when the height of the fourth bracket 23 is smaller than that of the first bracket 11, the fourth bracket 23 includes ground feet 234, the fourth bracket 23 is installed on the side surface of the first bracket 11, and the fifth rectangle frame 231 of the fourth bracket 23 and the first rectangle frame 111 of the first bracket 11 are positioned in the same plane. The fourth bracket 23 is connected to the ground via the ground feet 234 of the fourth bracket 23, the server cabinet 4 may be simultaneously positioned above the fourth bracket 23 and the first bracket 11. The server cabinet 4 is mainly supported by the first bracket 11, the fourth bracket 23 has only the support function, and the filter mesh 21 and the heat-exchanger coil 22 may be directly installed in the fourth bracket 23. When the filter mesh 21 and the heat-exchanger coil 22 in the fourth bracket 23 need inspection and repair, the heights of the ground feet 234 may be adjusted such that the fourth bracket 23 suspends, and that the first bracket 11 is separated from the fourth bracket 23. Subsequently, the fourth bracket 23 below the server cabinet 4 is removed, thereby facilitating inspection and repair of the filter mesh 21 and the heat-exchanger coil 22.

When the height of the fourth bracket 23 is smaller than that of the first bracket 11, the filter mesh 21 may also be installed on the first supporting framework 24 and the heat-exchanger coil 22 may be installed on the second supporting framework 25, and hence the first supporting framework 24 and the second supporting framework 2 are installed in the fourth bracket 23. When the filter mesh 21 and the heat-exchanger coil 22 in the fourth bracket 23 need inspection and repair, the heights of the ground feet 234 may be adjusted such that the fourth bracket 23 suspends, and that the first bracket 11 is separated from the fourth bracket 23 and then removed, thereby facilitating inspection and repair of the filter mesh 21 and the heat-exchanger coil 22. Alternatively, the first supporting framework 24 and the second supporting framework 25 may be separated from the fourth bracket 23, and then removed, thereby facilitating inspection and repair of the filter mesh 21 and the heat-exchanger coil 22.

Figure 16:
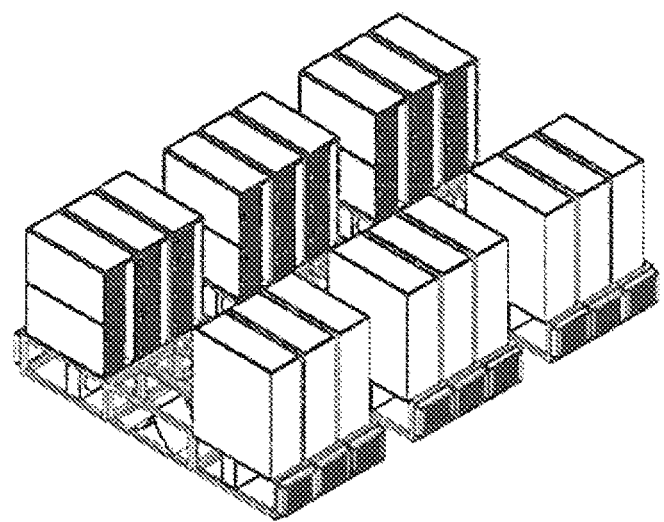
FIG. 16 is a schematic structural view of a system for cooling a server cabinet according to an embodiment of the present disclosure.

Referring to FIG. 16, a plurality of cooling apparatuses may form a cooling system.

The heat-exchanger, the blower, the filter, and sensor of each of the plurality of cooling apparatuses may share one control system, and an average temperature or maximum temperature mode is employed for cooling control.

The number of blowers may be larger than or equal to the number of server cabinets. One blower speed control system is configured for each of the blowers. Alternatively, a plurality of blowers may share one blower speed control system.

The heat-exchanger may employ a refrigerated water mode or a direct expansion mode.

When the heat exchanger employs the refrigerated water mode, all heat-exchanger coils in the system share one water distribution unit, where the water distribution unit serves as a distribution unit at the chief water outlet of the refrigerated water of the system and is responsible for providing distribution interfaces and maintenance interfaces for all the coils in the system.

When the heat exchanger employs the direct expansion mode, one heat-exchanger coil may be controlled by one control system, or a plurality of heat-exchanger coils may be controlled by one control system.

When a cooling system is formed by a plurality of cooling apparatuses, each four to five cooling apparatuses are spaced apart, thereby facilitating inspection and repair of various parts or components of the cooling system.

According to the embodiments of the present disclosure, a bracket is positioned below one or a plurality of server cabinets, and a heat-exchange device is installed on the side surface of the bracket, an air-ducting device is installed in the bracket, the heat-exchange device and the air-ducting device are parallelly arranged, the heat-exchange device cools hot air produced by the server cabinet to obtain cold air, and the air-ducting device blows the cold air to the server cabinet to cool the server cabinet. Since the heat-exchange device and the air-ducting device are positioned below the server cabinet, and are close to the server cabinet, the cold air is capable of directly reaching the server cabinet, thereby effectively cooling all the server cabinets in an Internet data center. In addition, this short-range air supply manner saves resources.

As illustrated in FIG. 2 or FIG. 3, an embodiment of the present disclosure provides a server cabinet apparatus, including at least one server cabinet 4 and an apparatus n for cooling a server cabinet.

The apparatus n includes: a bracket 1, a heat-exchange device 2, and an air ducting device 3.

The bracket 1 is positioned below one or a plurality of server cabinets 4, the heat-exchange device 2 is installed on a side surface of the bracket 1, the air-ducting device 3 is installed in the bracket 1, the heat-exchange device 2 and the air-ducting device 3 are parallelly arranged, the heat-exchange device 2 cools hot air produced by the server cabinet 4 to obtain cold air, and the air-ducting device 3 blows the cold air to the server cabinet 4 to cool the server cabinet 4.

Preferably, the air-ducting device 3 includes a blower 31 and a first air-ducting plate 32.

The heat-exchange device 2, the blower 31, and the first air-ducting plate 32 are sequentially arranged parallelly, the blower 31 is positioned below the server cabinet 4, and the first air-ducting plate 32 is positioned on an outer side of the server cabinet 4.

The inner side surface of the first air-ducting plate 32 is a concave curved surface, and the inner side surface faces towards the blower 31.

Alternatively, the first air-ducting plate 32 is a flat plate, the first air-ducting plate 32 is perpendicularly installed in the bracket 1 and includes a surface facing towards the blower 31.

Optionally, as illustrated in FIG. 4, the bracket 1 includes a first bracket 11 and a second bracket 12.

One side of the first bracket 11 is connected to one side of the second bracket 12, the first server cabinet 4 is positioned on the first bracket 11, the heat-exchange device 2 is installed on the other side of the first bracket 11, the blower 31 is installed in the first bracket 11 and the first air-ducting plate 32 is installed in the second bracket 12.

The distance between the blower 31 and the heat-exchange device 2 fills within a first preset range, the distance between the blower 31 and the first air-dueling plate 32 falls within a second preset range, and the distance between the first air-ducting plate 32 and the server cabinet 4 falls within a third preset range, such that the heat-exchange device 2 cools the hot air produced by the server cabinet 4 to obtain the cold air, the blower accelerates to blow the cold air to the first air-ducting plate 32, and the cold air is blown to the server cabinet 4 via the first air-ducting plate 32.

Optionally, the air outlet of the blower 31 may be provided with a first temperature sensor.

Optionally, as illustrated in FIG. 8, if the inner side surface of the first air-ducting plate 32 is a concave curved surface, the second bracket 12 is further installed with a second air-ducting plate 32a, where the side surface of the second air-ducting plate 32a is a concave curved surface.

The direction of the concave curved surface of the second air-ducting plate 32a is reverse to the direction of the concave curved surface of the first air-ducting plate 32 such that cold air blown from a third bracket 11a is blown to the second air-ducting plate 32a, and the cold air is blown to a second server cabinet 4a on the third bracket 11a via the second air-ducting plate 32a.

One side of the third bracket 11a is connected to the other side of the second bracket 12.

Optionally, as illustrated in FIG. 10, the heat-exchange device 2 includes the filter mesh 21, the heat-exchanger coil 22, and the fourth bracket 23 as illustrated in FIG. 11.

The filter mesh 21 and the heat-exchanger coil 22 are installed in the fourth bracket 23, and the heat-exchanger coil 22 is positioned on a side facing towards the blower 31.

The filter mesh 21 and the heat-exchanger coil 22 are parallelly arranged, or the filter mesh 21 and the heat-exchanger coil 22 are such arranged as to form a preset angle.

One side of the fourth bracket 23 is connected to one side of the bracket 1.

Optionally, the fourth bracket 23 further includes a height adjusting member capable of adjusting the height of the fourth bracket 23.

The height adjusting member may be four height-adjustable ground feet 234, where the ground feet 234 are installed on the fourth bracket 23.

Optionally, the heat-exchange device 2 further includes a second temperature sensor, where the second temperature sensor is installed on the side of the filter mesh 21 which side faces towards the heat-exchanger coil 22.

According to the embodiments of the present disclosure, a bracket is positioned below one or a plurality of server cabinets, and a heat-exchange device is installed on the side surface of the bracket, an air-ducting device is installed in the bracket, the heat-exchange device and the air-ducting device are parallelly arranged, the heat-exchange device cools hot air produced by the server cabinet to obtain cold air, and the air-ducting device blows the cold air to the server cabinet to cool the server cabinet. Since the heat-exchange device and the air-ducting device are positioned below the server cabinet, and are close to the server cabinet, the cold air is capable of directly reaching the server cabinet, thereby effectively cooling all the server cabinets in an Internet data center. In addition, this short-range air supply manner saves resources.

As illustrated in FIG. 8 or FIG. 9, an embodiment of the present disclosure provides a server cabinet apparatus, including: a first server cabinet 4, a second server cabinet 4a, and an apparatus for cooling a server cabinet, where the first server cabinet 4 is positioned the first bracket 11 of the apparatus for cooling a server cabinet, and the second server cabinet 4a is positioned on the third bracket 11a of the apparatus for cooling a server cabinet.

The apparatus for cooling a server cabinet includes: a bracket, a heat-exchange device, and an air ducting device.

The bracket is positioned below one or a plurality of first server cabinets, the heat-exchange device is installed on a side surface of the bracket, the air-ducting device is installed in the bracket, the heat-exchange device and the air-ducting device are parallelly arranged, the heat-exchange device cools hot air produced by the first server cabinet to obtain cold air, and the air-ducting device blows the cold air to the first server cabinet to cool the first server cabinet.

Preferably, the air-ducting device includes a blower 31 and a first air-ducting plate 32.

The heat-exchange device 2, the blower 31, and the first air-ducting plate 32 are sequentially arranged parallelly, the blower 31 is positioned below the first server cabinet 4, and the first air-ducting plate 32 is positioned on an outer side of the first server cabinet 4.

Optionally, the inner side surface of the first air-ducting plate 32 is a concave curved surface, and the inner side surface faces towards the blower 31.

The bracket includes a first bracket 11 and a second bracket 12.

One side of the first bracket 11 is connected to one side of the second bracket 12, the first server cabinet 4 is positioned on the first bracket 11, the heat-exchange device 2 is installed on the other side of the first bracket 11, the blower 31 is installed in the first bracket 11, and the first air-ducting plate 32 is installed in the second bracket 12.

The second bracket 12 is further installed with a second air-ducting plate 32a, the inner side surface of the second air-ducting plate 32a is a concave curved surface.

The direction of the concave curved surface of the second air-ducting plate 32a is reverse to the direction of the concave curved surface of the first air-ducting plate 32 such that cold air blown from a third bracket 11a is blown to the second air-ducting plate 32a, and the cold air is blown to a second server cabinet 4a on the third bracket 11a via the second air-ducting plate 32a.

One side of the third bracket 11a is connected to the other side of the second bracket 12.

According to the embodiments of the present disclosure, a bracket is positioned below one or a plurality of server cabinets, and a heat-exchange device is to installed on the side surface of the bracket, an air-ducting device is installed in the bracket, the heat-exchange device and the air-ducting device are parallelly arranged, the heat-exchange device cools hot air produced by the server cabinet to obtain cold air, and the air-ducting device blows the cold air to the server cabinet to cool the server cabinet. Since the heat-exchange device and the air-ducting device are positioned below the server cabinet, and are close to the server cabinet, the cold air is capable of directly reaching the server cabinet, thereby effectively cooling all the server cabinets in an Internet data center. In addition, this short-range air supply manner saves resources.

An embodiment of the present disclosure provides an Internet data center, including at least one server cabinet apparatus according to an above-described embodiment.

As illustrated in FIG. 16, the Internet data center includes a plurality of server cabinet apparatuses according to an above described embodiment, where each four to five server cabinet apparatuses are spaced apart such that various parts or components of the Internet data center are inspected and repaired.

When the Internet data center includes a plurality of server cabinet apparatuses according to an above-described embodiment (such as shown in FIG. 2-3), the case is analogous to the scenario where the Internet data center includes a plurality of server cabinet apparatuses according to an above-described embodiment(such as shown in FIG. 8-9).

According to the embodiments of the present disclosure, a bracket is positioned below one or a plurality of server cabinets, and a heat-exchange device is installed on the side surface of the bracket, an air-ducting device is installed in the bracket, the heat-exchange device and the air-ducting device are parallelly arranged, the heat-exchange device cools hot air produced by the server cabinet to obtain cold air, and the air-ducting device blows the cold air to the server cabinet to cool the server cabinet. Since the heat-exchange device and the air-ducting device are positioned below the server cabinet, and are close to the server cabinet, the cold air is capable of directly reaching the server cabinet, thereby effectively cooling all the server cabinets in an Internet data center. In addition, this short-range air supply manner saves resources.

Described above are merely exemplary embodiments of the present disclosure, but are not intended to limit the present disclosure. Any modification, equivalent replacement, or improvement made without departing from the spirit and principle of the present disclosure should fall within the protection scope of the present disclosure.

What is claimed is:

1. An apparatus for cooling a server cabinet, comprising: a bracket, a heat-exchange device, and an air-ducting device; wherein
   the bracket is positioned below one or a plurality of server cabinets, the heat-exchange device is installed on a side surface of the bracket, the air-ducting device is installed in the bracket, the heat-exchange device and the air-ducting device are parallelly arranged, the heat-exchange device cools hot air produced by the server cabinet to obtain cold air, and the air-ducting device blows the cold air to the server cabinet to cool the server cabinet;
   the air-ducting device comprises a blower and a first air-ducting plate;
   the blower is positioned below the server cabinet, and the first air-ducting plate is positioned on an outer side of the server cabinet; and
   an inner side surface of the first air-ducting plate is a concave curved surface, the inner side surface facing towards the blower, such that cold air blown from the blower is blown to the inner side surface.

2. The apparatus according to claim 1,
   wherein the heat-exchange device, the blower, and the first air-ducting plate are sequentially arranged parallelly.

3. The apparatus according to claim 2, wherein the bracket comprises a first bracket and a second bracket;
   wherein one side of the first bracket is connected to one side of the second bracket, the server cabinet is arranged on the first bracket, the heat-exchange device is installed on the other side of the first bracket, the blower is installed in the first bracket, and the first air-ducting plate is installed in the second bracket.

4. The apparatus according to claim 3, wherein a distance between the blower and the heat-exchange device falls within a first preset range, a distance between the blower and the first air-ducting plate falls within a second preset range, and a distance between the first air-ducting plate and the server cabinet falls within a third preset range, such that the heat-exchange device cools the hot air produced by the server cabinet to obtain the cold air, the blower accelerates to blow the cold air to the first air-ducting plate, and the cold air is blown to the server cabinet via the first air-ducting plate.

5. The apparatus according to claim 4, wherein an air outlet of the blower is further provided with a first temperature sensor.

6. The apparatus according to claim 1, wherein a second air-ducting plate is further installed in the second bracket, an inner side surface of the second air-ducting plate being a concave curved surface;
   wherein a direction of the concave curved surface of the second air-ducting plate is reverse to a direction of the concave curved surface of the first air-ducting plate, such that cold air blown from a third bracket is blown to the second air-ducting plate, and the cold air is blown to the server cabinet on the third bracket via the second air-ducting plate;
   wherein one side of the third bracket is connected to the other side of the second bracket.

7. The apparatus according to claim 3, wherein a second air-ducting plate is further installed in the second bracket, an inner side surface of the second air-ducting plate being a concave curved surface;
   wherein a direction of the concave curved surface of the second air-ducting plate is reverse to a direction of the concave curved surface of the first air-ducting plate, such that cold air blown from a third bracket is blown to the second air-ducting plate, and the cold air is blown to the server cabinet on the third bracket via the second air-ducting plate;
   wherein one side of the third bracket is connected to the other side of the second bracket.

8. The apparatus according to claim 1, wherein the heat-exchange device comprises a filter mesh, a heat-exchanger coil, and a fourth bracket; wherein
   The filter mesh and the heat-exchanger coil are installed in the fourth bracket, and the heat-exchanger coil is positioned on a side facing towards the blower;
   The filter mesh and the heat-exchanger coil are parallelly arranged, or the filter mesh and the heat-exchanger coil are such arranged as to form a preset angle; and
   one side of the fourth bracket is connected to one side of the bracket.

9. The apparatus according to claim 8, further comprising a height adjusting member capable of adjusting a height of the fourth bracket.

10. The apparatus according to claim 9, wherein the height adjusting member comprises four height-adjustable ground feet, the ground feet are installed on the fourth bracket.

11. The apparatus according to claim 8, wherein the heat-exchange device further comprises a second temperature sensor, the second temperature sensor being installed on the side of the filter mesh which side faces towards the heat-exchanger coil.

12. A server cabinet apparatus, comprising: an apparatus for cooling a server cabinet and at least one server cabinet; wherein
   the apparatus for cooling a server cabinet comprises: a bracket, a heat-exchange device, and an air ducting device; wherein
   the bracket is positioned below one or a plurality of server cabinets, the heat-exchange device is installed on a side surface of the bracket, the air-ducting device is installed in the bracket, the heat-exchange device and the air-ducting device are parallelly arranged, the heat-exchange device cools hot air produced by the server cabinet to obtain cold air, and the air-ducting device blows the cold air to the server cabinet to cool the server cabinet;
   the air-ducting device comprises a blower and a first air-ducting plate;

the blower is positioned below the server cabinet, and the first air-ducting plate is positioned on an outer side of the server cabinet; and an inner side surface of the first air-ducting plate is a concave curved surface, the inner side surface facing towards the blower, such that cold air blown from the blower is blown to the inner side surface.

13. The apparatus according to claim 12, wherein the heat-exchange device, the blower, and the first air-ducting plate are sequentially arranged parallelly, a second air-ducting plate is installed in the second bracket, an inner side surface of the second air-ducting plate being a concave curved surface;

wherein a direction of the concave curved surface of the second air-ducting plate is reverse to a direction of the concave curved surface of the first air-ducting plate, such that cold air blown from a third bracket is blown to the second air-ducting plate, and the cold air is blown to the server cabinet on the third bracket via the second air-ducting plate;

wherein one side of the third bracket is connected to the other side of the second bracket.

14. The apparatus according to claim 12, wherein the heat-exchange device, the blower, and the first air-ducting plate are sequentially arranged parallelly;

the bracket comprises a first bracket and a second bracket, wherein one side of the first bracket is connected to one side of the second bracket, the server cabinet is arranged on the first bracket, the heat-exchange device is installed on the other side of the first bracket, the blower is installed in the first bracket, the first air-ducting plate is installed in the second bracket;

a second air-ducting plate is installed in the second bracket, an inner side surface of the second air-ducting plate being a concave curved surface;

wherein a direction of the concave curved surface of the second air-ducting plate is reverse to a direction of the concave curved surface of the first air-ducting plate, such that cold air blown from a third bracket is blown to the second air-ducting plate, and the cold air is blown to the server cabinet on the third bracket via the second air-ducting plate;

wherein one side of the third bracket is connected to the other side of the second bracket.

15. An Internet data center, comprising at least one server cabinet apparatus; wherein the server cabinet apparatus comprises: an apparatus for cooling a server cabinet and at least one server cabinet; wherein the apparatus for cooling a server cabinet comprises: a bracket, a heat-exchange device, and an air ducting device; wherein the bracket is positioned below one or a plurality of server cabinets, the heat-exchange device is installed on a side surface of the bracket, the air-ducting device is installed in the bracket, the heat-exchange device and the air-ducting device are parallelly arranged, the heat-exchange device cools hot air produced by the server cabinet to obtain cold air, and the air-ducting device blows the cold air to the server cabinet to cool the server cabinet;

the air-ducting device comprises a blower and a first air-ducting plate;

the blower is positioned below the server cabinet, and the first air-ducting plate is positioned on an outer side of the server cabinet;

an inner side surface of the first air-ducting plate is a concave curved surface, the inner side surface facing towards the blower, such that cold air blown from the blower is blown to the inner side surface.

16. The Internet data center according to claim 15, wherein the heat-exchange device, the blower, and the first air-ducting plate are sequentially arranged parallelly a second air-ducting plate is installed in the second bracket, an inner side surface of the second air-ducting plate being a concave curved surface;

wherein a direction of the concave curved surface of the second air-ducting plate is reverse to a direction of the concave curved surface of the first air-ducting plate, such that cold air blown from a third bracket is blown to the second air-ducting plate, and the cold air is blown to the server cabinet on the third bracket via the second air-ducting plate;

wherein one side of the third bracket is connected to the other side of the second bracket.

17. The Internet data center according to claim 15, wherein the heat-exchange device, the blower, and the first air-ducting plate are sequentially arranged parallelly the bracket comprises a first bracket and a second bracket, wherein one side of the first bracket is connected to one side of the second bracket, the server cabinet is arranged on the first bracket, the heat-exchange device is installed on the other side of the first bracket, the blower is installed in the first bracket, the first air-ducting plate is installed in the second bracket;

a second air-ducting plate is installed in the second bracket, an inner side surface of the second air-ducting plate being a concave curved surface;

wherein a direction of the concave curved surface of the second air-ducting plate is reverse to a direction of the concave curved surface of the first air-ducting plate, such that cold air blown from a third bracket is blown to the second air-ducting plate, and the cold air is blown to the server cabinet on the third bracket via the second air-ducting plate;

wherein one side of the third bracket is connected to the other side of the second bracket.

\* \* \* \* \*